United States Patent [19]

Morihisa et al.

[11] Patent Number: 4,567,575
[45] Date of Patent: Jan. 28, 1986

[54] VOLTAGE LEVEL COMPENSATING INTERFACE CIRCUIT FOR INTER-LOGIC CIRCUIT DATA TRANSMISSION SYSTEM

[75] Inventors: Mitsuo Morihisa, Nara; Hideyuki Akao, Osaka, both of Japan

[73] Assignee: Sharp Kabushiki Kaisha, Osaka, Japan

[21] Appl. No.: 726,933

[22] Filed: Apr. 26, 1985

Related U.S. Application Data

[63] Continuation of Ser. No. 309,047, Oct. 6, 1981, abandoned.

[30] Foreign Application Priority Data

Oct. 14, 1980 [JP] Japan ................ 55-146710[U]

[51] Int. Cl.[4] .............................................. G06F 3/04
[52] U.S. Cl. ..................................... 364/900; 307/475; 365/189
[58] Field of Search ... 364/200 MS File, 900 MS File; 365/203, 189; 307/446, 475; 371/72

[56] References Cited

U.S. PATENT DOCUMENTS

| | | |
|---|---|---|
| 3,757,310 | 9/1973 | Croxon . |
| 3,835,457 | 9/1974 | Yu ........................... 307/475 |
| 3,906,453 | 9/1975 | Mattedi et al. ............... 364/200 |
| 4,000,413 | 12/1976 | Wong et al. .................. 307/475 |
| 4,048,673 | 9/1977 | Hendrie et al. .............. 364/200 |
| 4,075,679 | 2/1978 | Christopher et al. .......... 364/900 |
| 4,096,398 | 6/1978 | Khaitan ....................... 307/475 |
| 4,110,633 | 8/1978 | Blaser et al. ................ 307/205 |
| 4,134,103 | 1/1979 | Huxtable et al. .......... 340/146.1 AB |
| 4,195,356 | 3/1980 | O'Connell et al. ............ 365/189 |
| 4,213,189 | 7/1980 | Mueller et al. .............. 364/900 |
| 4,275,313 | 6/1981 | Boll et al. ................... 307/448 |
| 4,276,617 | 6/1981 | Le .............................. 365/189 |
| 4,301,381 | 11/1981 | Clemens et al. .............. 307/475 |
| 4,306,163 | 12/1981 | Blume, Jr. et al. ........... 307/475 |
| 4,357,548 | 11/1982 | Preslar ........................ 307/475 |
| 4,451,907 | 5/1984 | Donoghue et al. ............ 365/203 |
| 4,472,647 | 9/1984 | Allgood et al. .............. 307/475 |

OTHER PUBLICATIONS

D. R. McGlynn; *Microprocessors–Technology, Architecture, and Applications;* (John Wiley & Sons, 1976) pp. 56–59.

*Primary Examiner*—James D. Thomas
*Assistant Examiner*—Archie E. Williams
*Attorney, Agent, or Firm*—Birch, Stewart, Kolasch & Birch

[57] ABSTRACT

An interface circuit is disposed between an NMOS random access memory and a PMOS central processor unit in order to ensure accurate data transfer therebetween. The interface circuit includes a pull-up system for pulling up a signal transmission line to a desired voltage level. The pull-up system is energized when the data signal is transferred from the NMOS random access memory into the PMOS central processor unit. The pull-up operation is not conducted when the data signal is transferred from the PMOS central processor unit into the NMOS random access memory.

4 Claims, 6 Drawing Figures

| INPUT/OUTPUT \ MODE | READ | | WRITE |
|---|---|---|---|
| Vin1 | Vss | 0 | 0 |
| Vin2 | 0 | Vss | 0 |
| Tr1 | ON | OFF | OFF |
| Tr2 | OFF | ON | OFF |
| Vout | OUTPUT STATE | H | L | HIGH IMPEDANCE |
| | VOLTAGE LEVEL WHEN Vss=5(V) | ABOVE 2.4(V) | BELOW 0.4(V) | |
| Vin | INPUT STATE | 'H' | 'L' | |
| | VOLTAGE LEVEL WHEN Vss=5(V) | ABOVE 2(V) | BELOW 0.8(V) | |

FIG. 2

| INPUT/OUTPUT | MODE | READ | WRITE |
|---|---|---|---|
| Vin | "L" (Vss=5(V)) | BELOW 1.0 (V) | |
| | "H" (Vss=5(V)) | ABOVE 2.5 (V) | |
| Vout | "L" (Vss=5(V)) | | BELOW 0.5 (V) |
| | "H" (Vss=5(V)) | | ABOVE 3.2 (V) |

FIG. 4

VOLTAGE LEVEL COMPENSATING INTERFACE CIRCUIT FOR INTER-LOGIC CIRCUIT DATA TRANSMISSION SYSTEM

This application is a continuation, of application Ser. No. 309,047 filed on Oct. 6, 1981, now abandoned.

BACKGROUND OF THE INVENTION

The present invention relates to an interface circuit disposed between at least two semiconductor circuits.

The present invention relates more specifically to an interface circuit included in a control circuit of an electronic apparatus which is implemented with a random access memory and a central processor unit.

Recently, various domestic appliances have been developed which include a microcomputer control system. To design various operations, a plurality of versatile-use large scale integrated circuit elements are desired to be included in a control system. These LSI elements must be correlated with each other so that control signals are transferred between the plurality of LSI elements in the bi-directional fashion.

However, there is a possibility that the two LSI elements have different voltage levels in their logic circuits, respectively. More specifically, there is a possibility that the output voltage level of the logic "high" of a first LSI is lower than the threshold level of the logic "high" of an input level of a second LSI. If, these two LSI's are directly connected with each other, an accurate signal transfer can not be assured.

OBJECTS OF THE INVENTION

Accordingly, an object of the present invention is to provide an interface circuit disposed between at least two LSI's for assuring an accurate signal transfer in the bi-directional fashion.

Another object of the present invention is to provide an interface circuit disposed between at least two LSI's for compensating for the voltage difference of the input/output threshold levels between the at least two LSI's.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

SUMMARY OF THE INVENTION

To achieve the above objects, pursuant to an embodiment of the present invention, an interface circuit is disposed between a first semiconductor element and a second semiconductor element. In a preferred form, the first semiconductor element comprises an NMOS random access memory and the second semiconductor element comprises a PMOS central processor unit. A control signal is developed from the PMOS central processor unit in order to selectively connect a pull-up circuit to the interface circuit, thereby compensating for the voltage level difference between the NMOS random access memory and the PMOS central processor unit. More specifically, the pull-up operation is conducted only when the logic signal is transferred from the NMOS random access memory to the PMOS central processor unit. The pull-up operation is not conducted when the logic signal is transferred from the PMOS central processor unit to the NMOS random access memory.

BRIEF DESCRIPTION OF THE DRAWINGS

The present invention will be better understood from the detailed description given hereinbelow and the accompanying drawings which are given by way of illustration only, and thus are not limitative of the present invention and wherein:

FIG. 2 is an input/output characteristic chart of the NMOS LSI circuit of FIG. 1;

FIG. 4 is an input/output characteristic chart of the PMOS LSI circuit of FIG. 3;

DESCRIPTION OF THE PREFERRED EMBODIMENTS

Typical constructions of an NMOS LSI circuit and a PMOS LSI circuit will be first described with reference to FIGS. 1 through 4 in order to facilitate a better understanding of the present invention.

Figure 1:
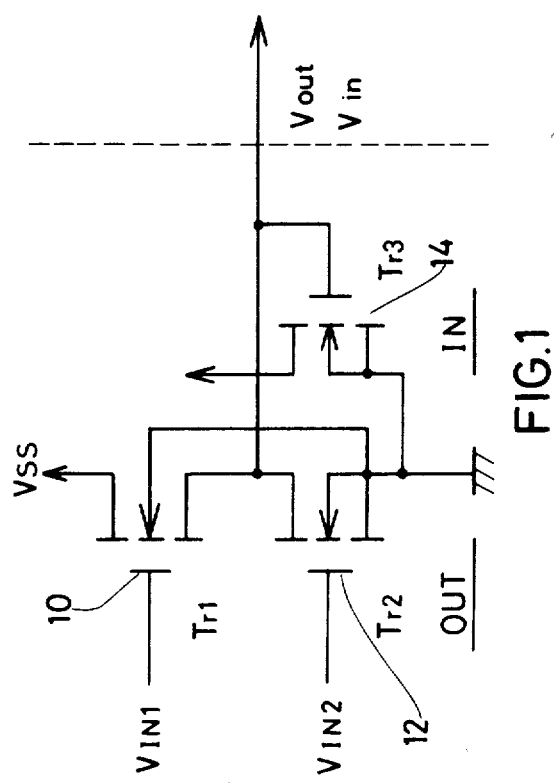
FIG. 1 is a circuit diagram of an input/output circuit of a typical NMOS LSI circuit.

FIG. 1 shows an input/output circuit of an NMOS LSI circuit. The input/output circuit of FIG. 1 comprises NMOS transistors $10(Tr_1)$, $12(Tr_2)$ and $14(Tr_3)$ of the enhancement mode. Various controls can be performed by selectively determining the states of $V_{IN1}$ and $V_{IN2}$ as shown in FIG. 2.

The input/output circuit of the NMOS enhancement mode inevitably has a defect that the output voltage never becomes close to the power supply voltage level $V_{ss}$. That is, the limit level of the logic "high" of the $V_{out}$ is 2.4 volts as shown in FIG. 2 when the power supply voltage level $V_{ss}$ is 5 volts. This relatively low level output creates problems when the above-mentioned NMOS LSI circuit is associated with a PMOS LSI circuit.

Figure 3:
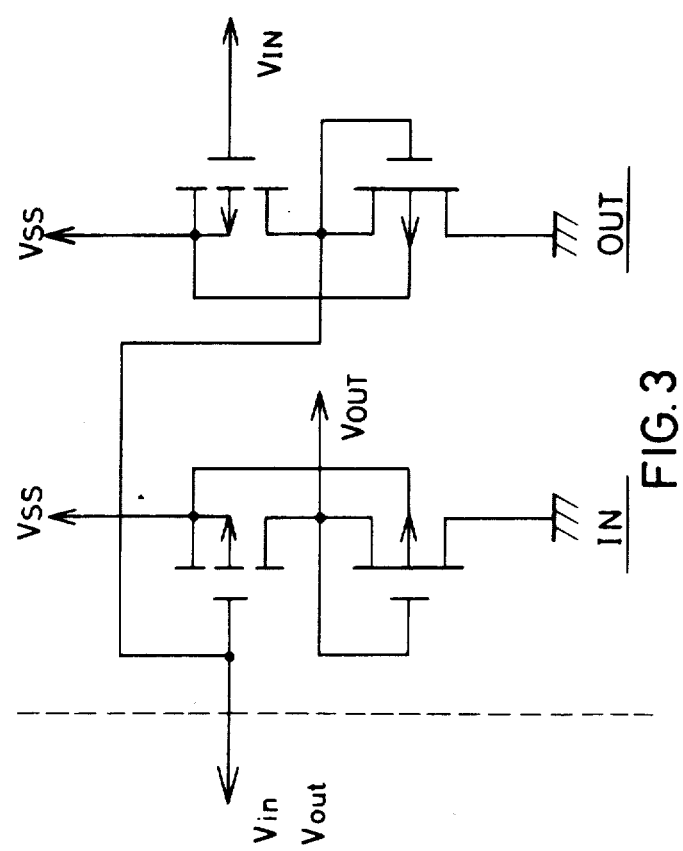
FIG. 3 is a circuit diagram of an input/output circuit of a typical PMOS LSI circuit.

FIG. 3 shows a typical construction of an input/output circuit of a PMOS LSI circuit. The PMOS LSI circuit is generally implemented with enhancement/depletion mode MOS transistors and, therefore, the output voltage can become close to the power supply voltage level $V_{ss}$ as compared with the NMOS enhacement type as shown in FIG. 4.

Figure 5:
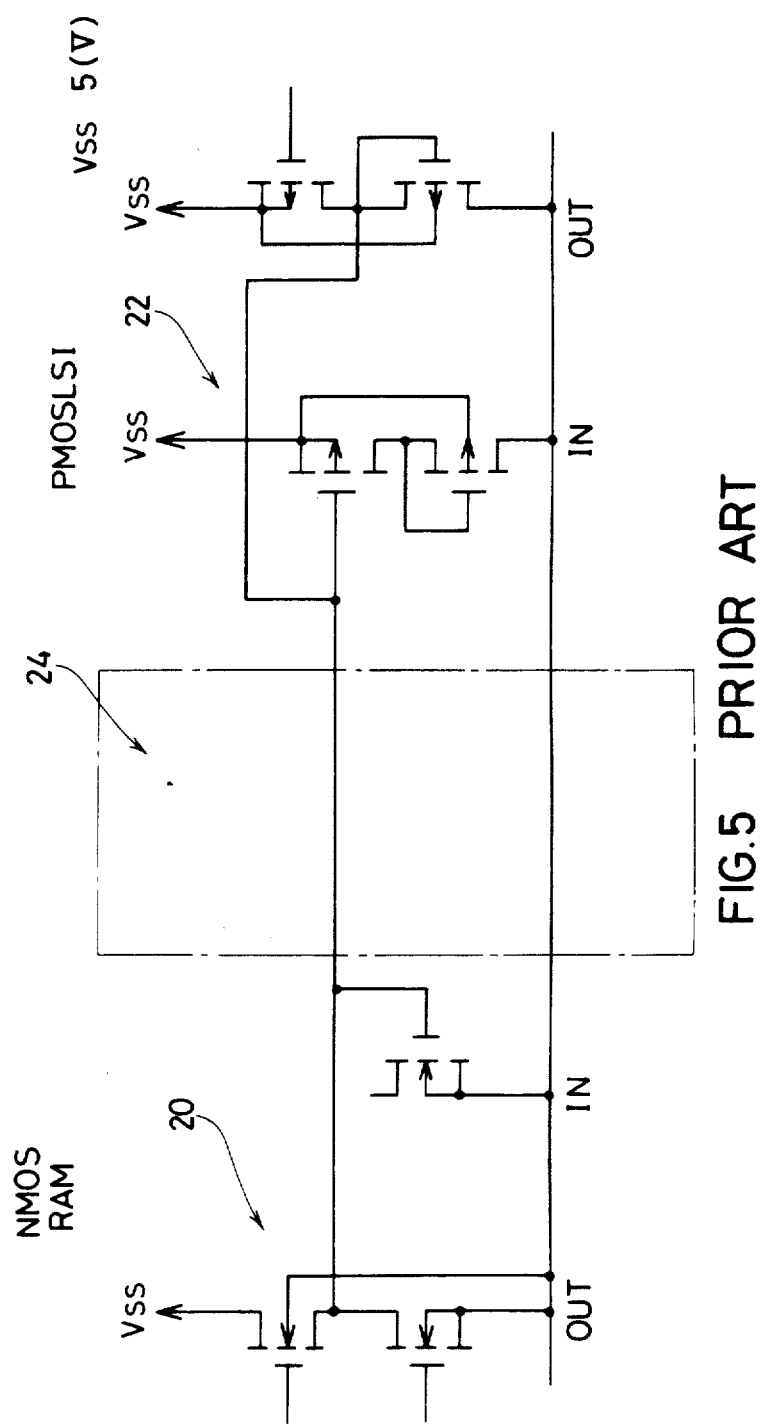
FIG. 5 is a circuit diagram of a correlation circuit of prior art for connecting the NMOS LSI circuit of FIG. 1 and the PMOS LSI circuit of FIG. 3.

FIG. 5 shows a conventional connection system for connecting the above-mentioned input/output circuits of the NMOS LSI and the PMOS LSI.

The connection system of FIG. 5 comprises an input/output circuit 20 of an NMOS random access memory, an input/output circuit 22 of a PMOS central processor unit, and a signal transmission portion 24 disposed between the two input/output circuits 20 and 22. It will be clear from FIGS. 2 and 4 that the threshold level of the logic "high" in the output side of the NMOS random access memory is 2.4 volts(min), whereas the threshold level of the logic "high" in the input side of the PMOS central processor unit is 2.5 volts(min). This difference of 0.1 volts may create a problem that the PMOS central processor unit does not read the logic "high" even when the NMOS random access memory develops an output signal of the logic "high". Thus, there is a possibility that the data is not accurately transferred from the random access memory to the central processor unit. To prevent the erroneous operation, the output voltage level of the NMOS random access memory should be compensated for in the signal transmission portion 24 so that the central processor unit accurately reads the data developed from the random access memory.

Figure 6:
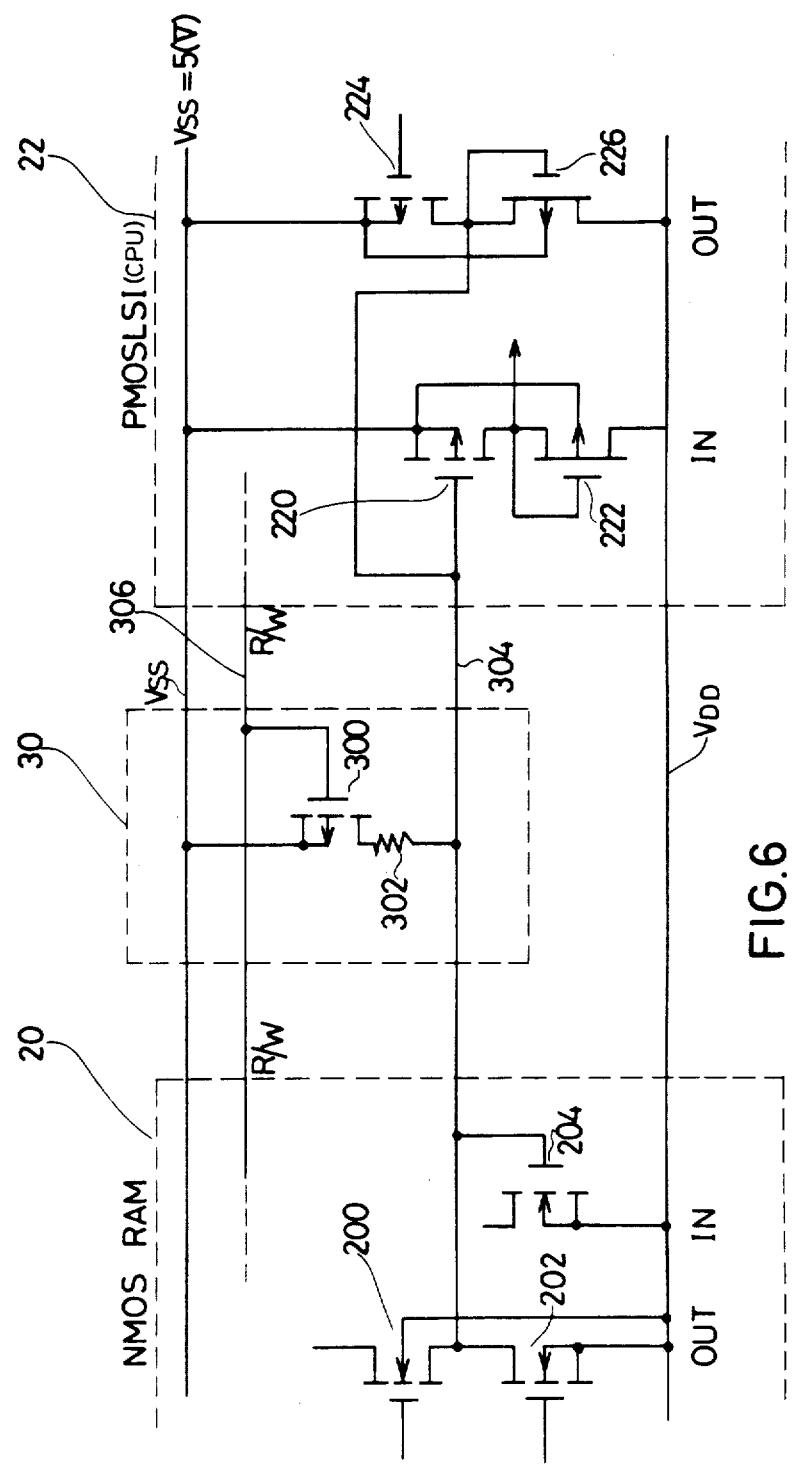
FIG. 6 is a circuit diagram of an embodiment of a voltage level compensating circuit of the present invention for connecting the NMOS LSI circuit of FIG. 1 and the PMOS LSI circuit of FIG. 3.

FIG. 6 shows an embodiment of an interface circuit of the present invention.

An interface circuit 30 is disposed between the NMOS random access memory 20 and the PMOS central processor unit 22. The interface circuit 30 comprises a PMOS switching element 300 and a resistor 302. A series circuit comprising the PMOS switching element 300 and the resistor 302 is disposed between a power supply line $V_{ss}$ (for example, +5 volts) and a signal transmission line 304. The gate electrode of the PMOS switching element 300 is connected to receive a read/write control signal derived from the PMOS central processor unit 22 via a read/write control line 306. The read/write control signal bears the logic "low" in the read mode for reading out the data from the NMOS random access memory 20, and bears the logic "high" in the write mode for writing the data from the PMOS central processor unit 22 into the NMOS random access memory 20.

The NMOS random access memory 20 includes NMOS switching elements 200 and 202 which function to develop the data signal when the read/write control signal bears the logic "low". The NMOS random access memory 20 further includes an NMOS switching element 204 which functions to introduce the data signal when the read/write control signal bears the logic "high". The PMOS central processor unit 22 includes a PMOS inverter element 220 and a PMOS resistance element 222 of the depletion type which, in combination, function to read in the data provided by the NMOS random access memory 20 into the PMOS central processor unit 22 when the read/write control signal bears the logic "low". The PMOS central processor unit 22 further includes a PMOS inverter element 224 and a PMOS resistance element 226 of the depletion type which, in combination, function to develop the data signal toward the NMOS random access memory 20 when the read/write control signal bears the logic "high".

When the read/write control signal bears the logic "low" in the read mode, the PMOS switching element 300 is switched on to create an electric current flowing from the power supply line $V_{ss}$ through the resistor 302. Thus, the signal transmission line 304 is pulled up to a predetermined level. When the read/write control signal developed from the PMOS central processor unit 22 bears the logic "high" in the write mode, the PMOS switching element 300 is switched off so no current is conducted through the resistor 302. The signal transmission line 304 is not pulled up and, therefore, there is no influence on the signal transfer from the PMOS central processor unit 22 to the NMOS random access memory 20.

The pull-up operation can be expressed as follows: In the read mode, the PMOS switching element 300 is switched on as discussed above. Now assume that the ON resistance of the PMOS switching element 300 is $R_{300}$. When the NMOS random access memory 20 develops the data signal of the logic "high", the NMOS switching element 200 is switched on. When the ON resistance of the NMOS switching element 200 is $R_{200}$, the voltage level $V_{304}$ of the signal transmission line 304 can be expressed as follows:

$$V_{304} = \frac{R_{226}}{R_{226} + \frac{R_{200}(R_{300} + R_{302})}{R_{200} + R_{300} + R_{302}}} (V_{ss} - V_{DD})$$

where:

$R_{226}$ is a resistance value of the PMOS resistance element 226; and $R_{302}$ is a resistance value of the resistor 302.

The resistance value $R_{302}$ of the resistor 302 should be selected so that the voltage level $V_{304}$ of the signal transmission line 304 becomes higher than the voltage level of the logic "high" of the input signal $V_{in}$ (shown in FIG. 4) of the PMOS central processor unit 22.

In a preferred form, the NMOS random access memory 20 is made of "RAM 2114" manufactured by Intel Corporation, and the PMOS central processor unit 22 is made of "CPU SM-3" manufactured by Sharp Corporation.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A data signal transmission system in an electronic apparatus comprising:
    at least two semiconductor logic circuits;
        said at least two semiconductor logic circuits including:
        a first semiconductor logic circuit in which an output voltage level of a logic "high" bears a first voltage level; and
        a second semiconductor logic circuit in which an input voltage level of a logic "high" bears a second voltage level, wherein said second voltage level is higher than said first voltage level;
    interface circuit means disposed between said at least two semiconductor logic circuits for transferring data signals between said first and second semiconductor logic circuits in either direction;
    said interface circuit means consisting essentially of:
        a single signal transmission line interconnecting said first and second semiconductor circuits for transfer of each information bit;
        pull-up circuit means for pulling up said signal transmission line to a desired voltage level so that when said output voltage level of said first semiconductor logic circuit is a logic "high" the level on said signal transmission line is raised at least to said second voltage level; and
        a switching element operatively interconnected between said signal transmission line and said pull-up circuit means; and
        a control system for switching said switching element so that said signal transmission line is connected to said pull-up circuit means only when a said data signal is transferred from said first semiconductor logic circuit to said second semiconductor logic circuit.

2. The data signal transmission system of claim 1, wherein said first semiconductor logic circuit comprises a random access memory implemented with NMOS transistors of the enhancement mode.

3. The data signal transmission system of claim 1 or 2, wherein said second semiconductor logic circuit comprises a central processor unit implemented with PMOS transistors of the enhancement/depletion mode.

4. The data signal transmission system of claim 3, wherein said control system is included in said central processor unit.

* * * * *